(12) United States Patent
Hou et al.

(10) Patent No.: US 8,504,972 B2
(45) Date of Patent: Aug. 6, 2013

(54) STANDARD CELLS HAVING FLEXIBLE LAYOUT ARCHITECTURE/BOUNDARIES

(75) Inventors: Yung-Chin Hou, Taipei (TW); David Barry Scott, Plano, TX (US); Lee-Chung Lu, Taipei (TW); Li-Chun Tien, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 264 days.

(21) Appl. No.: 12/697,887

(22) Filed: Feb. 1, 2010

(65) Prior Publication Data

US 2010/0269081 A1 Oct. 21, 2010

Related U.S. Application Data

(60) Provisional application No. 61/169,610, filed on Apr. 15, 2009.

(51) Int. Cl.
*G06F 17/50* (2006.01)

(52) U.S. Cl.
USPC ............ 716/135; 716/116; 716/123; 716/130

(58) Field of Classification Search
USPC .................................. 716/116, 123, 130, 135
See application file for complete search history.

(56) References Cited

U.S. PATENT DOCUMENTS 5,369,595 A * 11/1994 Gould et al. .................. 257/203
2006/0190893 A1 * 8/2006 Morton ........................... 716/10

* cited by examiner

*Primary Examiner* — Jack Chiang
*Assistant Examiner* — Brandon Bowers
(74) *Attorney, Agent, or Firm* — Slater & Matsil, L.L.P.

(57) ABSTRACT

An integrated circuit layout includes a standard cell, which includes a first gate strip and a second gate strip parallel to each other and having a gate pitch; a first boundary and a second boundary on opposite ends of the first standard cell; and a third boundary and a fourth boundary on opposite ends of the first standard cell and parallel to the first gate strip and the second gate strip. A cell pitch between the third boundary and the fourth boundary is not equal to integer times the gate pitch. A PMOS transistor is formed of the first gate strip and a first active region. An NMOS transistor is formed of the first gate strip and a second active region.

19 Claims, 7 Drawing Sheets

US 8,504,972 B2

STANDARD CELLS HAVING FLEXIBLE LAYOUT ARCHITECTURE/BOUNDARIES

This application claims the benefit of U.S. Provisional Application No. 61/169,610 filed on Apr. 15, 2009, entitled "Standard Cells Having Flexible Layout Architecture/Boundaries," which application is hereby incorporated herein by reference.

TECHNICAL FIELD

This invention relates generally to integrated circuits, and more particularly to the design of standard cells in integrated circuits.

BACKGROUND

In the design of modern integrated circuits, particularly digital circuits, standard cells having fixed functions are widely used. Standard cells are often pre-designed and saved in cell libraries. At the time integrated circuits (applications) are designed, the standard cells are retrieved from the cell libraries and placed into desirable locations. Routing is then performed to connect the standard cells with each other and with other customized circuits on the same chip.

To ensure that design rules, which include a set of pre-defined design rules guiding the design, are not violated when the standard cells are placed, the design of standard cells has to follow some design rules initially. For example, active regions (such as source regions and drain regions) have to be spaced apart from the cell boundaries, so that when neighboring cells are abutted, the active regions of neighboring cells will not undesirably adjoin each other.

Such precaution, however, incurs area penalties. The reserved space between the active regions and the respective cell boundaries results in a significant increase in the areas of the standard cells. In addition, since the active regions are spaced apart from the cell boundaries, when the standard cells are placed abutting each other, the active regions will not be joined, even if some of the active regions in neighboring standard cells need to be electrically coupled. These physically disconnected active regions have to resort to metal lines in order to electrically connect to each other. However, even if the active regions are electrically connected by the metal lines, they are still physically discontinuous, and the performance of the resulting device will be worse than if the active regions are continuous.

SUMMARY OF THE INVENTION

In accordance with another aspect of the present invention, an integrated circuit layout includes a standard cell, which includes a first gate strip and a second gate strip parallel to each other and having a gate pitch; a first boundary and a second boundary on opposite ends of the standard cell; and a third boundary and a fourth boundary on opposite ends of the standard cell and parallel to the first gate strip and the second gate strip. A cell pitch between the third boundary and the fourth boundary is not equal to integer times the gate pitch. A PMOS transistor is formed of the first gate strip and a first active region. An NMOS transistor is formed of the first gate strip and a second active region.

In accordance with yet another aspect of the present invention, an integrated circuit layout includes a first standard cell and a second standard cell. The first standard cell includes a first gate strip and a second gate strip parallel to each other and having a gate pitch; a first boundary and a second boundary on opposite ends of the first standard cell; and a third boundary and a fourth boundary on opposite ends of the first standard cell and parallel to the first gate strip and the second gate strip. A cell pitch between the third boundary and the fourth boundary is not equal to integer times the gate pitch. The first standard cell further includes a PMOS transistor having a first portion of the first gate strip as a first gate; and a first source region and a first drain region adjacent the first gate. The first standard cell further includes an NMOS transistor having a second portion of the first gate strip as a second gate; and a second source region and a second drain region adjacent the second gate. The second standard cell includes a fifth boundary and a sixth boundary on opposite ends of the first standard cell, wherein the fifth boundary abuts the third boundary of the first standard cell; and a third source region adjoining one of the first source region and the second source region to form an integrated source region.

In accordance with yet another aspect of the present invention, an integrated circuit layout includes a standard cell having a cell length in a cell length direction and a cell width in a cell width direction. The standard cell includes a first gate strip extending in the cell length direction, a PMOS transistor, and an NMOS transistor. The PMOS transistor includes a first portion of the first gate strip as a first gate; and a first source region and a first drain region adjacent the first gate. The NMOS transistor includes a second portion of the first gate strip as a second gate; and a second source region and a second drain region adjacent the second gate. The standard cell further includes a second gate strip extending in the cell length direction and spaced apart from the first gate strip by at least one drain region, wherein the first gate strip and the second gate strip have a gate pitch, and wherein the cell width is not equal to integer times the gate pitch; a VDD power line coupled to the first source region; and a VSS power line coupled to the second source region.

The advantageous features of the present invention include reduced chip area usage and improved device performance due to continuous active regions.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the present invention are discussed in detail below. It should be appreciated, however, that the embodiments provide many applicable inventive concepts that can be embodied in a wide variety of specific contexts. The specific embodiments discussed are merely illustrative of specific ways to make and use the invention, and do not limit the scope of the invention.

A novel standard cell design and layout are presented. The variations of the embodiment are discussed. Throughout the various views and illustrative embodiments of the present invention, like reference numbers are used to designate like elements. The layouts of the standard cells throughout the description may be saved in cell libraries, which are further embodied on a non-transitory storage media, such as a hard drive, a disc, or the like.

Figure 1:
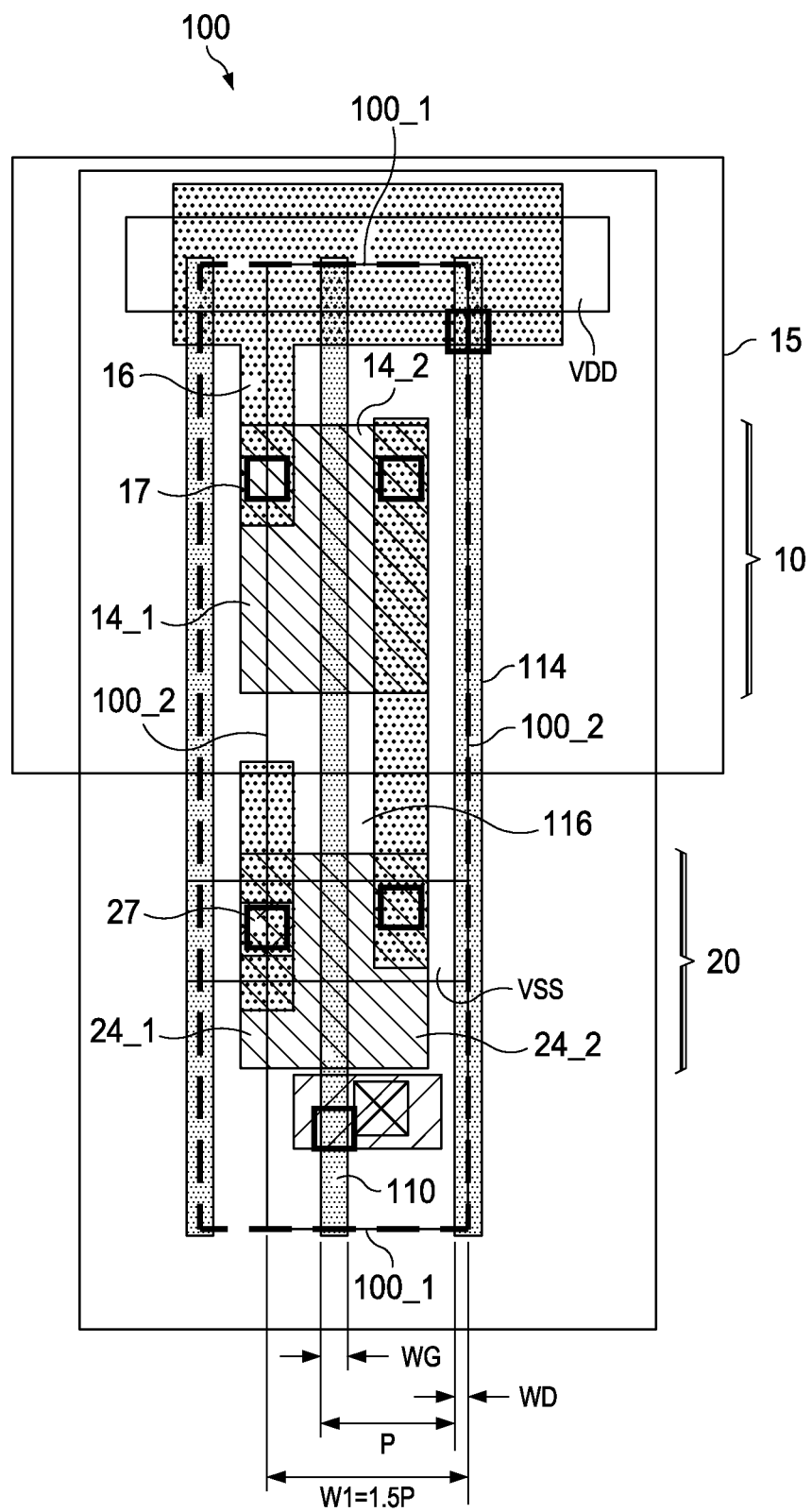
FIG. 1 illustrates a layout of an inverter in accordance with an embodiment of the present invention.

FIG. 1 illustrates a layout of standard inverter cell 100 in accordance with an embodiment. The cell boundaries of standard inverter cell 100 are denoted as 100_1 and 100_2, which includes top and bottom boundaries 100_1, and left and right boundaries 100_2. The features outside of boundaries 100_1 and 100_2 do not belong to standard inverter cell 100. However, to explain the concept of the embodiment, the prospective features outside of standard cell 100 are also illustrated to demonstrate what the circuit may look like when standard inverter cell 100 abuts other standard cells.

In an embodiment of the present invention, gate strips, including active gate strips that act as the gates of transistors, and dummy gate strips that do not act as the gates of any transistor, are formed in the form of parallel strips. In standard inverter cell 100 or other standard cells, all gate strips may be formed as parallel strips, with no other patterns used. For example, all gate strips are equally spaced and extend in a same direction, with no gate strip extending in a lengthwise direction perpendicular to the lengthwise direction of other gate strips. Further, it is likely that in a standard cell, all gate strips either have a standard width, or one-half of the standard width.

Referring to FIG. 1, standard inverter cell 100 includes PMOS transistor 10, which is formed of gate strip 110 and underlying (p-type) active region 14 (denoted as 14_1 and 14_2), which includes source region 14_1 and drain region 14_2 on opposite sides of gate strip 110. PMOS transistor 10 is formed in p-well 15. A power supply line (rail) known as power line VDD is connected to source region 14_1 of PMOS transistor 10 through metal line 16 and contact plug 17, wherein power line VDD supplies positive operation voltage VDD.

Standard inverter cell 100 further includes NMOS transistor 20, which is formed of gate strip 110 and underlying (n-type) active region 24 (denoted as 24_1 and 24_2), which includes source region 24_1 and drain region 24_2. Active regions 14 and 24 are spaced apart from each other by an isolation region, such as shallow trench isolation (STI) region 116. A power supply line known as VSS is connected to the source of NMOS transistor 20 through contact plug 27, wherein power supply line VSS may be grounded.

It is realized that each of source regions 14_1 and 24_1, contact plugs 17 and 27, and metal line 16 has a portion (for example, one-half) inside standard inverter cell 100, and another portion outside standard inverter cell 100. Accordingly, when standard inverter cell 100 is saved in a cell library and when it is placed on a circuit design, only a portion (one-half) of these regions are laid out, while the rest (such as the other halves) of these components need to be supplied by abutting other standard cells or filler cells, as will be discussed in subsequent paragraphs. In this case, the edges of source regions 14_1 and 24_1, contact plugs 17 and 27, and metal line 16 are aligned to (overlap) left boundary 100_2 of standard inverter cell 100. It is noted that only source regions 14_1 and 24_1 are aligned to cell boundary 100_2. Drain regions 14_2 and 24_2, however, are not aligned to the boundaries 100_1 and 100_2, and are spaced apart from both left and right boundaries 100_2.

On the right side of standard inverter cell 100, gate strip 114, which is a dummy gate strip, is placed. It is noted that gate strip 114 may only have one-half of the width inside standard inverter cell 100, while the other half is not included in standard inverter cell 100. Accordingly, width WD may be equal to one-half of width WG of gate strip 110. Gate strips 110 and 114 may be formed of polysilicon or other commonly used conductive materials such as metals, metal alloys, metal silicides, and/or the like. In an embodiment, each of the gate strips 110 and 114 are parallel to boundaries 100_2, and perpendicular to boundaries 100_1. Gate strips 110 and 114 have pitch P, which is measured from an edge of gate strip 114 inside standard inverter cell 100 (instead of the edge aligned to a respective boundary 100_2) to a respective edge of the neighboring gate strip 110. Each of the gate strips 110 and 114 may extend all the way from one of boundaries 100_1 to the other one of boundaries 100_1. In alternative embodiments wherein more than two gate strips 110 exist in a same standard cell, all of the gate strips may be parallel to each other, and parallel to boundaries 100_2. The gate strips may all have the same pitch P. Further, each of the gate strips, regardless of the total number, may extend all the way from one of boundaries 100_1 to the opposite one of the boundaries 100_1.

In an embodiment, width W1 of standard inverter cell 100 is not equal to the integer times pitch P. Throughout the description, the cell width is defined as being the dimension of the cell measured in the direction parallel to the extending direction of power lines VDD and VSS, while the cell length is defined as being the dimension of the standard cell measured in the direction perpendicular to the direction of power lines VDD and VSS. Cell width W1 is also referred to as a cell pitch. Generally, in the embodiments of the present invention, cell pitches of standard cells may be expressed as $N*P+A*P$, wherein N is an integer, P is the gate pitch (refer to FIG. 1), and A is a positive value less than 1. Further, A is very likely to be 0.5. For example, in FIG. 1, cell pitch W1 of standard inverter cell 100 is equal to 1.5 P. Throughout the description, the standard cells having cell pitches equal to $N*P+A*P$ are referred to as half-pitch cells, although indicator A may not be exactly 0.5, and regardless of whether integer N may be equal to zero or not. Those skilled in the art will recognize that this numerical limitation is intended to cover a range of cell pitches within measurement accuracy and within a range of process optimization. On the other hand, the standard cells having cell pitches equal to $N*P$ are referred to as whole-pitch cells.

Figure 2:
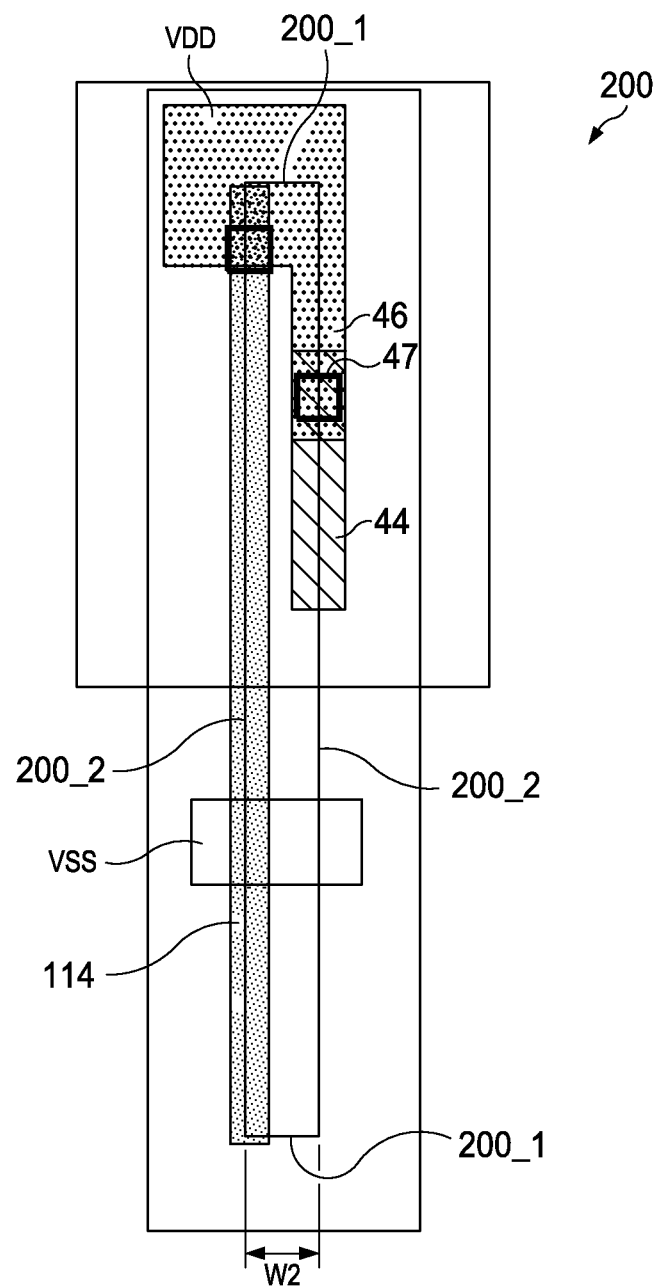
FIG. 2 illustrates a layout of a filler cell in accordance with an embodiment, wherein the filler cell is a half-pitch cell.

FIG. 2 illustrates filler cell 200, which is defined by boundaries 200_1 and 200_2. Again, some of features outside filler cell 200 are also illustrated. Filler cell 200 includes dummy poly 114, active region 44, metal 46 connected to power line VDD, and contact plug 47 connected between power line VDD and active region 44. Width W2 (the cell pitch) of filler cell 200 may be less than one gate pitch P as shown in FIG. 1. Further, cell pitch W2 may be equal to 0.5 P. It is noted that filler cell 200 includes one-half of each of active region 44, metal 46, dummy poly 114, and contact plug 47.

Figure 3:
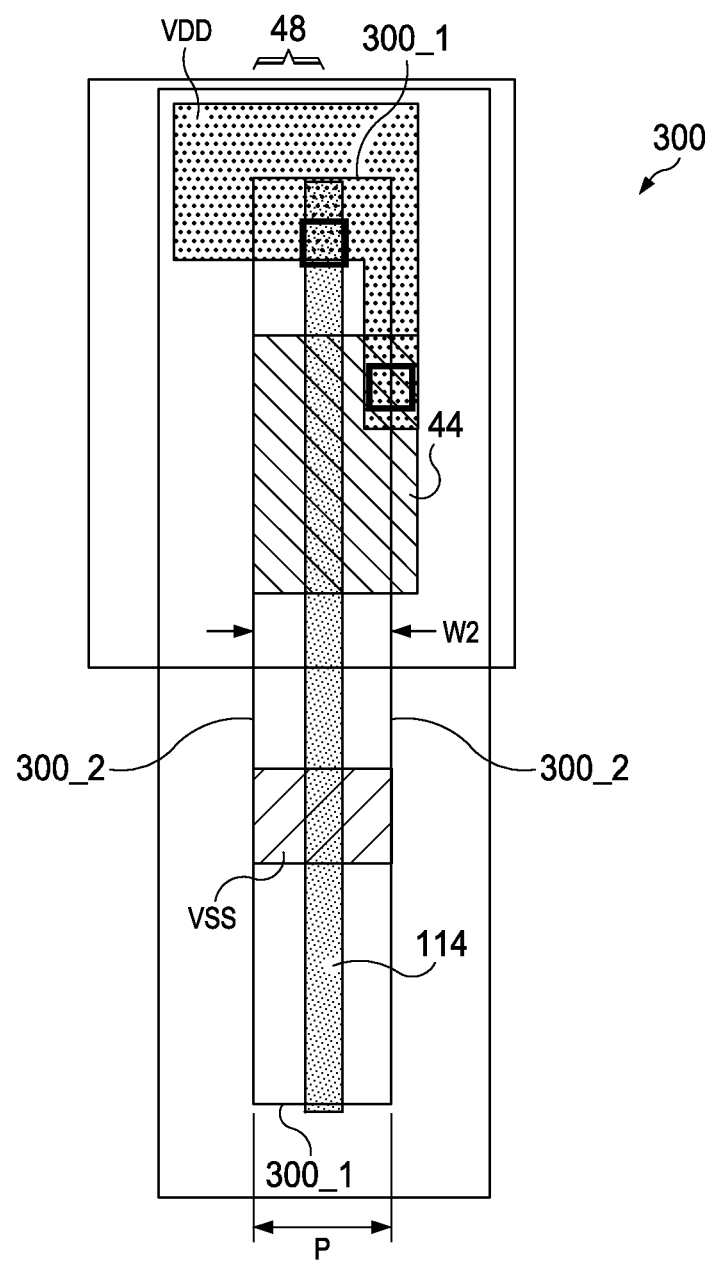
FIG. 3 illustrates a layout of a filler cell in accordance with an embodiment, wherein the filler cell is a whole-pitch cell.

FIG. 3 illustrates an additional filler cell 300, which is defined by boundaries 300_1 and 300_2. Filler cell 300 is a whole-pitch cell having cell pitch W2 equal to 1.0 P, wherein P is the gate pitch as shown in FIG. 1. Filler cell 300 as shown in FIG. 3 may include the structure included in filler cell 200 (FIG. 2) and additional portion 48. Different from filler cell 200, an entirety of dummy gate strip 114 is included in filler cell 300, while only one-half of dummy gate strip 114 is included in filler cell 200 as in FIG. 2. Filler cells 200 and 300 may be used to replenish the half-pitch cells, so that their source regions 14_1 and 14_2, metal lines 16, contact plugs 17 (refer to FIG. 1), and the like may be connected to the respective other halves.

Figure 4:
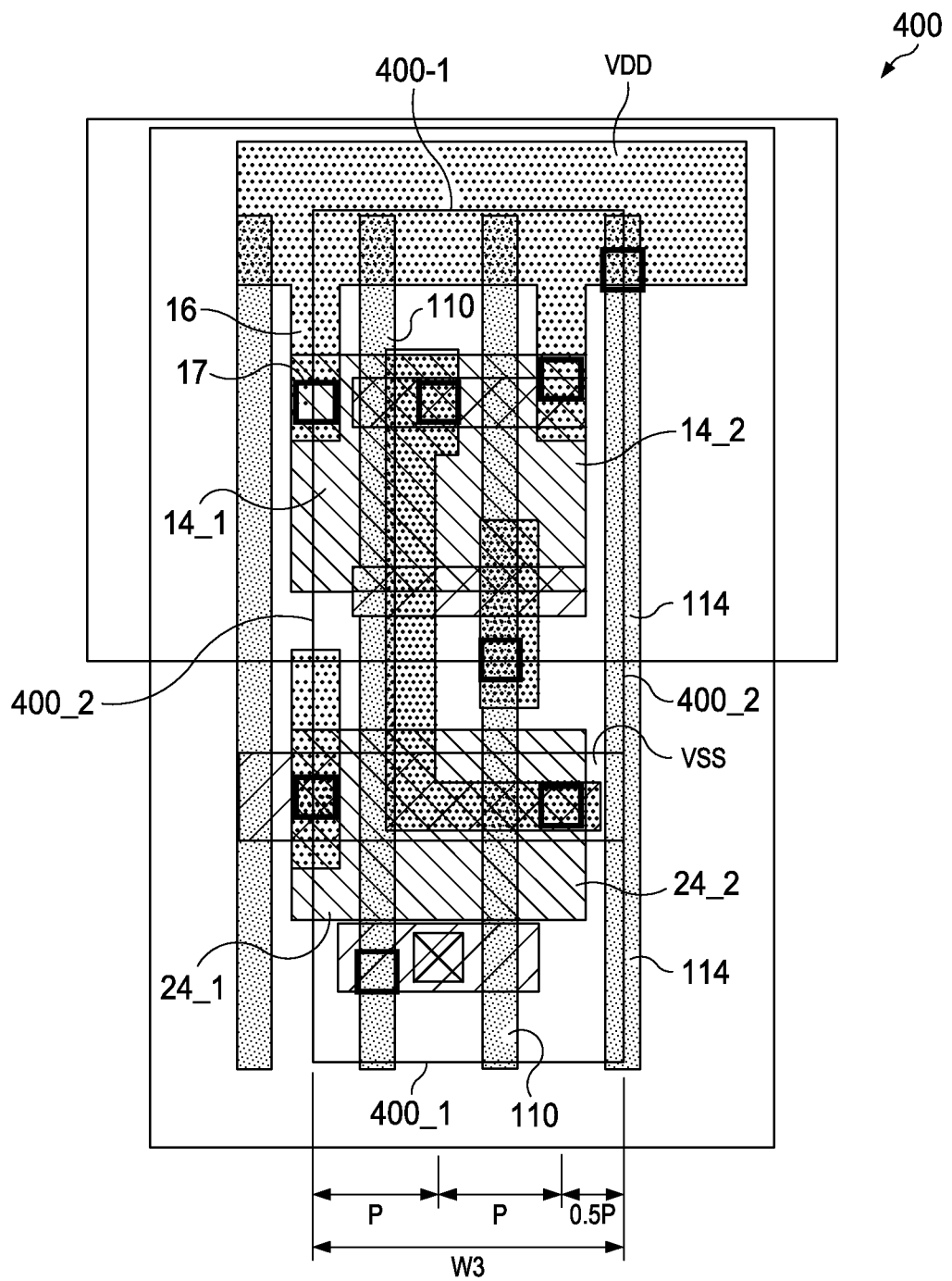
FIG. 4 illustrates a layout of a NAND gate in accordance with an embodiment.

FIG. 4 illustrates a NAND gate 400, which is defined by boundaries 400_1 and 400_2. NAND gate 400 includes two active gate strips 110 that are gates of transistors, and dummy gate strip 114. Gate strips 110 and 114 have equal pitches, which may be equal to pitch P as shown in FIG. 1. Again, gate strips 110 and 114 extend all the way from top boundary 400_1 to bottom boundary 400_1. Accordingly, cell pitch W3 of NAND gate 400 is equal to 2.5 P. Again, source regions 14_1 and 24_1 may extend all the way to left boundary 400_2, with edges of source regions 14_1 and 24_1 aligned to (overlapping) the respective boundary 400_2.

Figure 5:
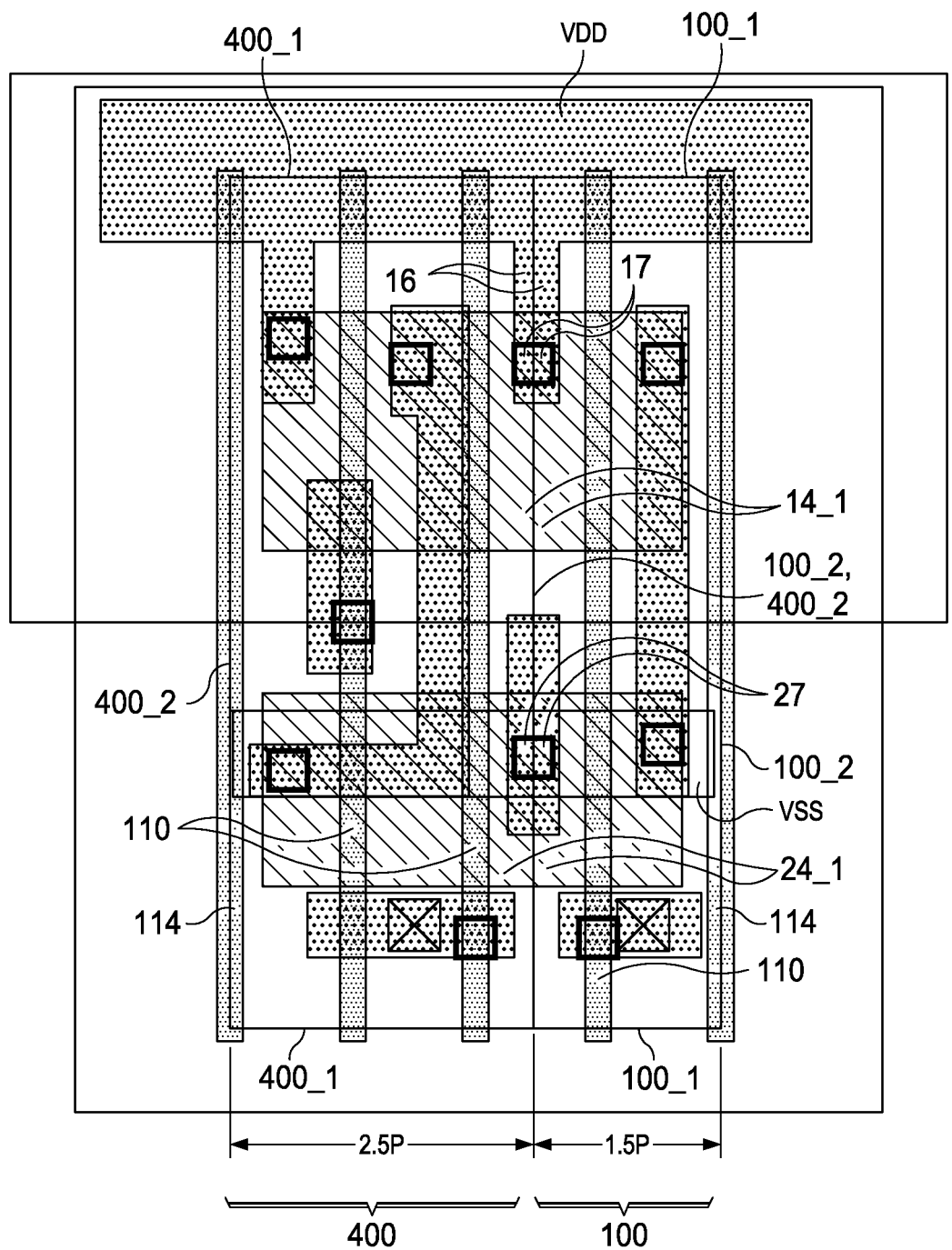
FIG. 5 illustrates a NAND gate abutted to an inverter cell in accordance with an embodiment.

FIG. 5 illustrates the abutting of standard inverter cell 100 to NAND gate 400. Again, the boundaries 100_1, 100_2, 400_1, and 400_2 are shown. Boundary 100_2 of standard inverter cell 100 is abutted to the boundary 400_2 of NAND gate 400. Accordingly, source region 14_1 in standard inverter cell 100 and source region 14_1 in NAND gate 400 join each other to form an integrated source region, metal line 16 in standard inverter cell 100 and metal line 16 in NAND gate 400 join each other to form an integrated metal line, and contact plug 17 in standard inverter cell 100 and contact plug 17 in NAND gate 400 join each other to form an integrated contact plug. Also, contact plug 27 in standard inverter cell 100 and contact plug 27 in NAND gate 400 join each other to form an integrated contact plug. It is realized that in standard inverter cell 100 and NAND gate 400, only source regions are aligned to the respective cell boundaries. Therefore, it is possible to physically join the source regions of neighboring cells. On the other hand, drain regions of the standard cells are physically spaced apart from the left and right cell boundaries, and hence drain regions of neighboring standard cells will not be automatically joined even if the standard cells are placed abutting each other.

Figure 6:
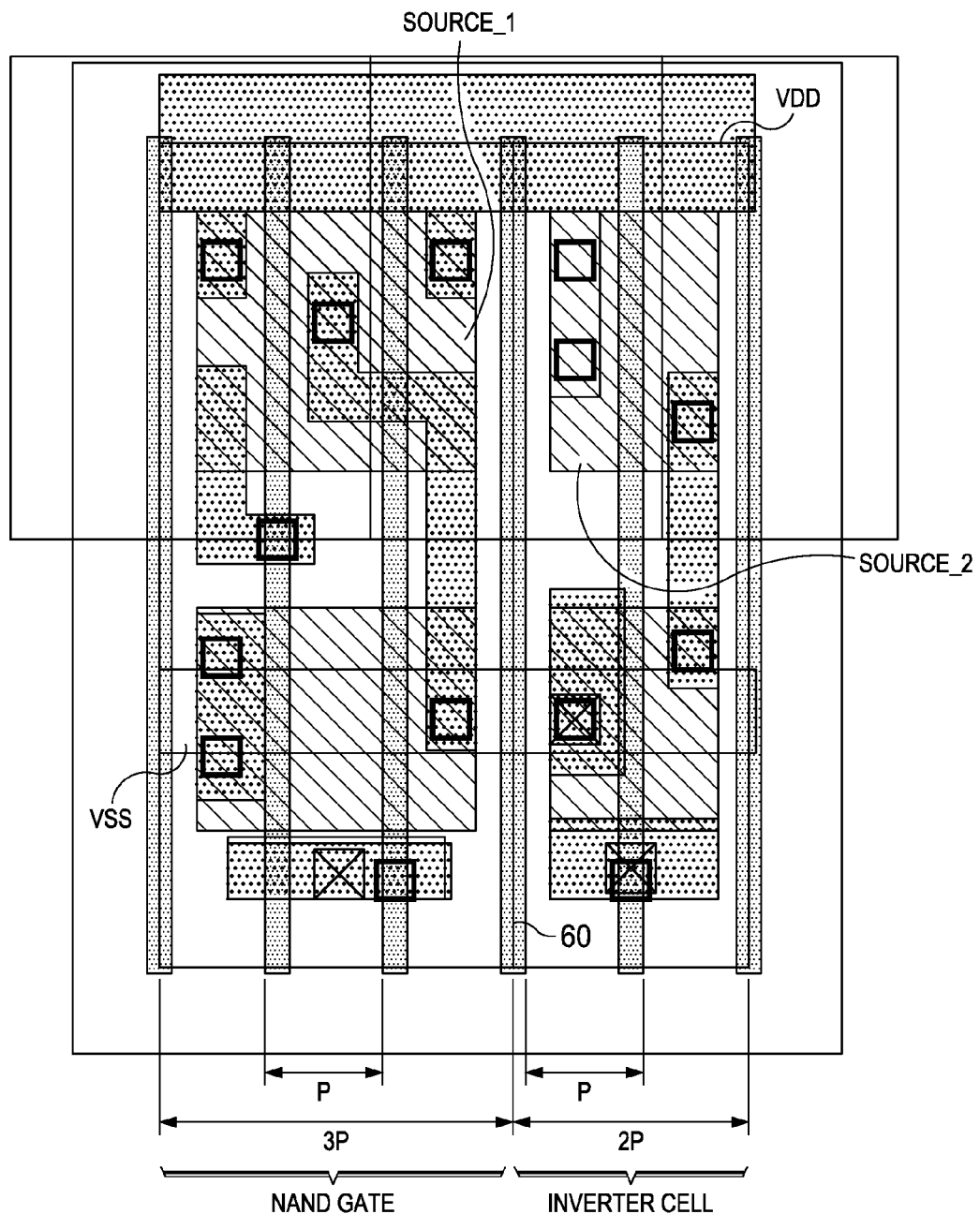
FIG. 6 illustrates a conventional NAND gate abutted to a conventional inverter cell.

After cells 100 and 400 are abutted, the cell pitch of the resulting combined cell is equal to 2.5 P+1.5 P, which is 4 P. As a comparison, FIG. 6 illustrates a conventional layout of the same circuit formed using conventional standard cells. Source region source_1 is spaced apart from cell boundary 60, and hence the cell pitch of the NAND gate is equal to integer times gate poly pitch P, which is 3 P. The source region source_2 of the inverter cell is also spaced apart from the respective cell boundary 60, and hence the cell pitch of the inverter cell is equal to integer times gate poly pitch P, which is 2 P in FIG. 6. Accordingly, by using the embodiments of the present invention, the pitch of the combined cell including a NAND cell and an inverter cell can be reduced from 5 P in conventional circuits to 4 P in embodiments of the present invention.

An additional advantageous feature is that source region 14_1 in NAND gate 400 (refer to FIG. 5) forms a continuous source region with source region 14_1 in inverter gate 10. This results in improved device performance. As a comparison, in FIG. 6, source regions source_1 and source_2 are physically spaced apart from each other by a dummy gate strip aligned to boundary 60, and hence source regions source_1 and source_2 have to be interconnected through a metal line. As is known in the art, discontinuous active regions result in degraded device performance.

Figure 7:
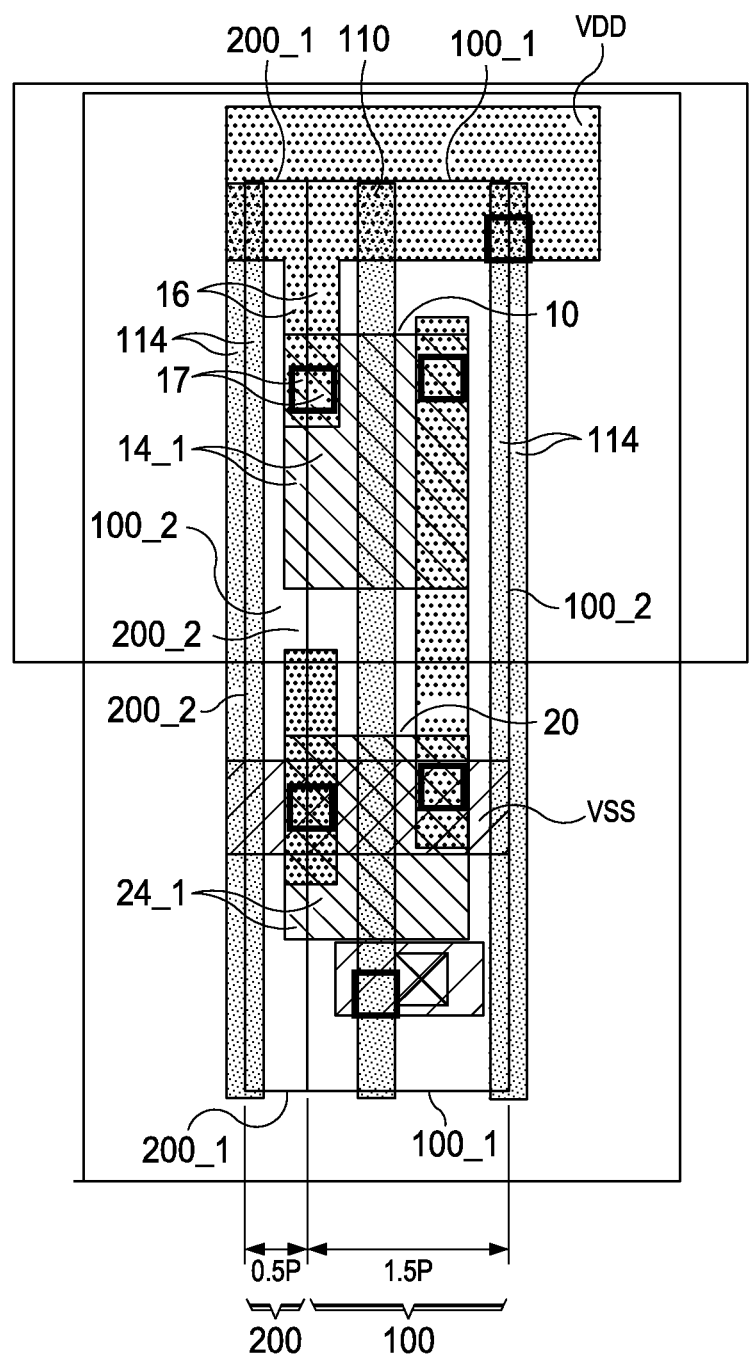
FIG. 7 illustrates an inverter cell abutted to a filler cell in accordance with an embodiment.

Although the source regions of the standard cell may be aligned to the respective cell boundaries, filler cells may be abutted to the standard cells to form devices, so that in the resulting combined cells, the source regions of the devices are also spaced apart from left and right boundaries of the combined cells. FIG. 7 illustrates an exemplary embodiment, wherein filler cell 200 abuts standard inverter cell 100. The ranges of filler cell 200 and standard inverter cell 100 may be found through the marked boundaries 200_1, 200_2, 100_1, and 100_2. In the resulting device, source region 14_1 includes one-half in filler cell 200, and one-half in standard inverter cell 100. Similarly, each of metal line 16 and contact plug 17 includes one-half in filler cell 200, and one-half in standard inverter cell 100. Using similar method, filler cell 300 as shown in FIG. 3 may be abutted to inverter cell 100 to increase the width of its source region, while still keeping source regions 14_1 and 24_1 aligned to the cell boundaries.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. An integrated circuit comprising:
a first standard cell, wherein the first standard cell comprises:
a first gate strip and a second gate strip parallel to each other and having a gate pitch;
a first boundary and a second boundary on opposite ends of the first standard cell, wherein the first gate strip and the second gate strip extend from the first boundary to the second boundary;
a third boundary and a fourth boundary on opposite ends of the first standard cell and parallel to the first gate strip and the second gate strip, wherein a cell pitch between the third boundary and the fourth boundary is not equal to integer times the gate pitch;
a PMOS transistor formed of the first gate strip and a first active region; and
an NMOS transistor formed of the first gate strip and a second active region.

2. The integrated circuit of claim 1, wherein the cell pitch is substantially equal to integer times the gate pitch plus one-half the gate pitch.

3. The integrated circuit of claim 1, wherein the PMOS transistor comprises a first source region and a first source contact plug, each having an edge aligned to the third boundary of the first standard cell, and wherein the NMOS transistor comprises a second source region and a second source contact plug, each having an edge aligned to the third boundary of the first standard cell.

4. The integrated circuit of claim 3, wherein the PMOS transistor further comprises a first drain region, and the NMOS transistor further comprises a second drain region, and wherein edges of the first drain region and the second drain region are spaced apart from the third boundary and the fourth boundary.

5. The integrated circuit of claim 3 further comprising a second standard cell comprising:
a fifth boundary abutting the third boundary of the first standard cell;
a third source region adjoining the first source region of the PMOS transistor to form an integrated source region; and
a third source contact plug adjoining the first source contact plug to form an integrated source contact plug.

6. The integrated circuit of claim 1, wherein the first gate strip is spaced apart from the third boundary and the fourth boundary, and wherein the second gate strip has an edge aligned to the fourth boundary and has a width substantially equal to one-half of a width of the first gate strip.

7. The integrated circuit of claim 6, wherein the first gate strip is an active gate strip, and the second gate strip is a dummy gate strip.

8. The integrated circuit of claim 1 further comprising a second standard cell comprising:
a fifth boundary and a sixth boundary on opposite ends of the second standard cell, wherein the fifth boundary abuts the third boundary of the first standard cell; and
a third gate strip parallel to, and adjoining, the second gate strip to form an integrated gate strip, wherein the integrated gate strip has a width equal to a width of the first gate strip.

9. An integrated circuit comprising:
a first standard cell comprising:
a first gate strip and a second gate strip parallel to each other and having a gate pitch;
a first boundary and a second boundary on opposite ends of the first standard cell, wherein the first gate strip and the second gate strip extend from the first boundary to the second boundary of the first standard cell;
a third boundary and a fourth boundary on opposite ends of the first standard cell and parallel to the first gate strip and the second gate strip, wherein a cell pitch between the third boundary and the fourth boundary is not equal to integer times the gate pitch;
a first PMOS transistor comprising:
a first portion of the first gate strip as a first gate; and
a first source region and a first drain region adjacent the first gate; and
a first NMOS transistor comprising:
a second portion of the first gate strip as a second gate; and
a second source region and a second drain region adjacent the second gate; and
a second standard cell:
a fifth boundary and a sixth boundary on opposite ends of the second standard cell, wherein the fifth boundary abuts the third boundary of the first standard cell; and
a third source region adjoining one of the first source region and the second source region to form an integrated source region.

10. The integrated circuit of claim 9, wherein the third boundary and the fourth boundary have a cell pitch substantially equal to integer times the gate pitch plus one-half the gate pitch.

11. The integrated circuit of claim 9 further comprising:
a first contact plug in the first standard cell and electrically connected to the one of the first source region and the second source region; and a second contact plug in the second standard cell and electrically connected to the third source region, wherein the first contact plug and the second contact plug physically join each other to form an integrated contact plug.

12. The integrated circuit of claim 9 further comprising:
a VDD power line extending from the first standard cell into the second standard cell; and
a metal line comprising a first portion in the first standard cell and a second portion in the second standard cell, wherein the first portion and the second portion join each other to form a combined metal line electrically connecting the VDD power line to the third source region.

13. The integrated circuit of claim 12, wherein the first gate strip is spaced apart from the third boundary and the fourth boundary, and wherein the second gate strip has an edge aligned to the fourth boundary, and has a width substantially equal to one-half a width of the first gate strip.

14. The integrated circuit of claim 13, wherein the second gate strip is a dummy gate strip.

15. An integrated circuit comprising:
a standard cell having a cell length in a cell length direction and a cell width in a cell width direction, wherein the standard cell is stored on a non-transitory storage media, and wherein the standard cell comprises:
a first boundary and a second boundary on opposite ends of the standard cell;
a first gate strip extending in the cell length direction from the first boundary to the second boundary;
a PMOS transistor comprising:
a first portion of the first gate strip as a first gate; and
a first source region and a first drain region adjacent the first gate;
an NMOS transistor comprising:
a second portion of the first gate strip as a second gate; and
a second source region and a second drain region adjacent the second gate;
a second gate strip extending in the cell length direction from the first boundary to the second boundary and spaced apart from the first gate strip by at least one drain region, wherein the first gate strip and the second gate strip have a gate pitch, and wherein the cell width is not equal to integer times the gate pitch;
a VDD power line coupled to the first source region; and
a VSS power line coupled to the second source region.

16. The integrated circuit of claim 15, wherein edges of the first source region and the second source region overlap a first cell boundary of the standard cell.

17. The integrated circuit of claim 16, wherein the second gate strip has an edge overlapping a second cell boundary of the standard cell, and wherein the second gate strip is a dummy gate strip.

18. The integrated circuit of claim 15, wherein the standard cell further comprises:
a first contact plug connected to the first source region; and
a second contact plug connected to the second source region, wherein edges of the first contact plug and the second contact plug overlap a cell boundary of the standard cell.

19. The integrated circuit of claim 15, wherein substantially all gate strips in the standard cell do not comprise any portion having a lengthwise direction parallel to the cell width direction, and wherein the cell width is substantially equal to integer times the gate pitch plus one-half the gate pitch.

* * * * *